(12) United States Patent
Shim et al.

(10) Patent No.: US 7,880,196 B2
(45) Date of Patent: Feb. 1, 2011

(54) IMAGE SENSOR AND METHOD FOR MANUFACTURING THE SAME

(75) Inventors: Hee-Sung Shim, Gangneung-si (KR);
Seoung-Hyun Kim, Pocheon-si (KR);
Joon Hwang, Cheongju-si (KR);
Kwang-Soo Kim, Seongnam-si (KR);
Jin-Su Han, Seongnam-Si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 8 days.

(21) Appl. No.: 12/344,540

(22) Filed: Dec. 28, 2008

(65) Prior Publication Data

US 2009/0166792 A1 Jul. 2, 2009

(30) Foreign Application Priority Data

Dec. 28, 2007 (KR) ...................... 10-2007-0141000

(51) Int. Cl.
*H01L 31/0328* (2006.01)
(52) U.S. Cl. ........................ 257/184; 257/187; 257/257; 257/258; 257/290; 257/292; 257/E31.064
(58) Field of Classification Search .................. 257/184, 257/257, 291, 187, 258, 290, 292
See application file for complete search history.

(56) References Cited

U.S. PATENT DOCUMENTS

| 6,169,319 B1* | 1/2001 | Malinovich et al. ......... 257/447 |
| 2003/0034507 A1* | 2/2003 | Berezin ...................... 257/233 |

FOREIGN PATENT DOCUMENTS

KR 1020070000578 A 1/2007

* cited by examiner

*Primary Examiner*—Wai-Sing Louie
(74) *Attorney, Agent, or Firm*—Sherr & Vaughn, PLLC

(57) ABSTRACT

Embodiments relate to an image sensor and a method of forming an image sensor. According to embodiments, an image sensor may include a first substrate and a photodiode. A circuitry including a metal interconnection may be formed on and/or over the first substrate. The photodiode may be formed over a first substrate, and may contact the metal interconnection. The circuitry of the first substrate may include a first transistor, a second transistor, an electrical junction region, and a first conduction type region. The first and second transistors may be formed over the first substrate. According to embodiments, an electrical junction region may be formed between the first transistor and the second transistor. The first conduction type region may be formed at one side of the second transistor, and may be connected to the metal interconnection.

11 Claims, 6 Drawing Sheets

IMAGE SENSOR AND METHOD FOR MANUFACTURING THE SAME

Figure 1:
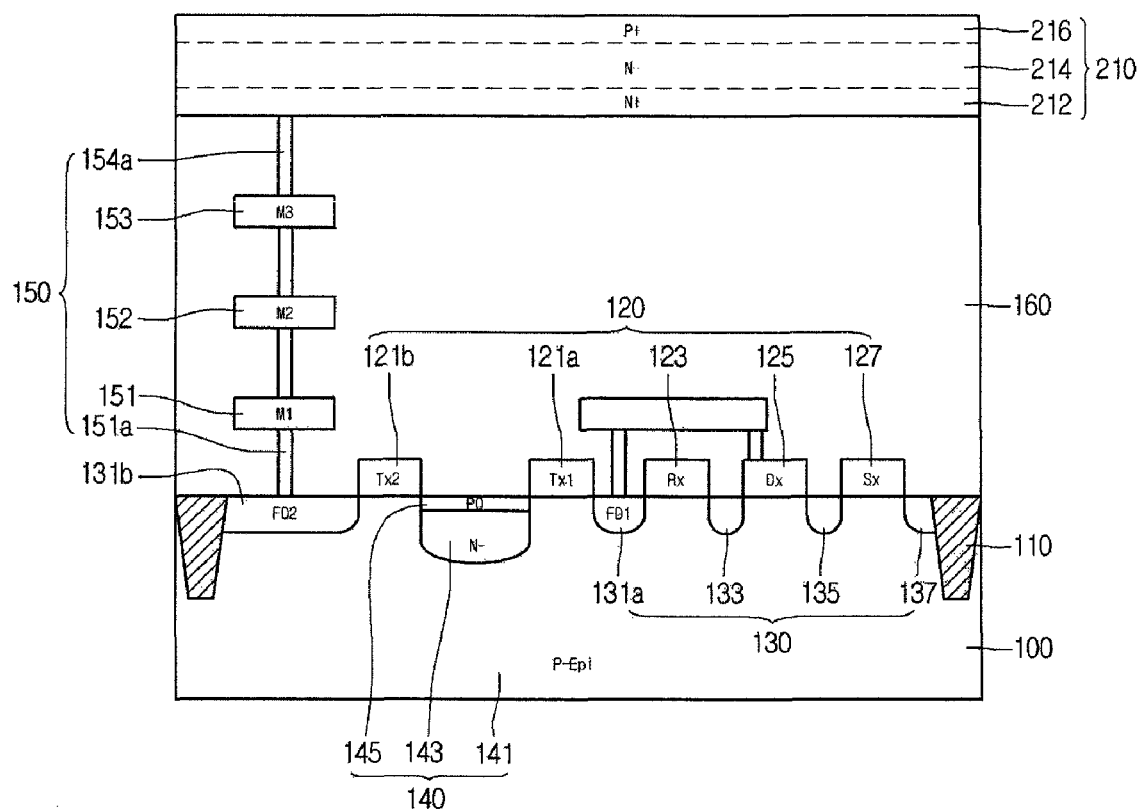
Figure 2:
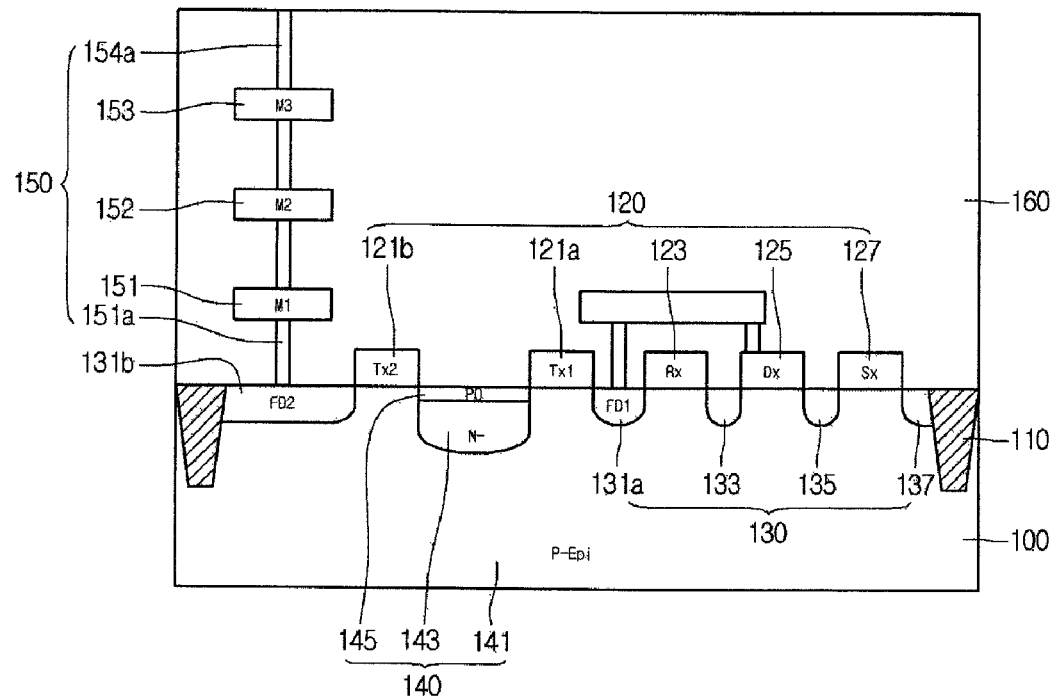

The present application claims priority under 35 U.S.C. 119 to Korean Patent Application No. 10-2007-0141000 (filed on Dec. 28, 2007), which is hereby incorporated by reference in its entirety.

BACKGROUND

An image sensor may be a semiconductor device that may convert an optical image into an electrical signal. An image sensor may be classified into categories, such as a charge coupled device (CCD) image sensor and a complementary metal oxide silicon (CMOS) image sensor (CIS).

During a fabrication process of an image sensor, a photodiode may be formed in a substrate using ion implantation. A size of a photodiode may be reduced to increase a number of pixels without increasing a chip size. This may reduce an area of a light receiving portion. Image quality may thereby be reduced.

Since a stack height may not reduce as much as a reduction in an area of a light receiving portion, a number of photons incident to a light receiving portion may also be reduced due to diffraction of light called Airy disk.

To address this limitation, a photodiode may be formed using amorphous silicon (Si). In addition, readout circuitry may be formed in a silicon (Si) substrate using a method such as wafer-to-wafer bonding, and a photodiode may be formed on and/or over readout circuitry (referred to as a three-dimensional (3D) image sensor). A photodiode may be connected with readout circuitry through a metal interconnection.

According to the related art, it may be difficult to electrically connect a photodiode to readout circuitry. That is, a metal interconnection may be formed on and/or over readout circuitry and wafer-to-wafer bonding may be performed such that a metal interconnection may contact the photodiode. Hence, a contact between a metal interconnection may be difficult, and an ohmic contact between a metal interconnection and a photodiode may be difficult.

Since both a source and a drain at both sides of a transfer transistor may be heavily doped with N-type impurities, a charge sharing phenomenon may occur. When a charge sharing phenomenon occurs, a sensitivity of an output image may be reduced and an image error may be generated. In addition, because a photo charge may not readily move between a photodiode and readout circuitry, a dark current may be generated and/or saturation and sensitivity may be reduced.

SUMMARY

Embodiments relate to an image sensor and a manufacturing method thereof that may prevent an occurrence of charge sharing and may increase a fill factor.

Embodiments relate to an image sensor and a manufacturing method thereof that may minimize a dark current source and may prevent reduction in saturation and sensitivity by providing a relatively swift movement path for a photo charge between a photodiode and a readout circuitry.

According to embodiments, an image sensor may include at least one of the following. A first substrate on and/or over which a circuitry including a metal interconnection may be formed. A photodiode on and/or over a first substrate, the photodiode contacting the metal interconnection, where the circuitry of the first substrate may include a first transistor and a second transistor over the first substrate. An electrical junction region between the first transistor and the second transistor. A first conduction type region at one side of the second transistor, the first conduction type region being connected to the metal interconnection.

According to embodiments, an image sensor may include at least one of the following. A first substrate on and/or over which a circuitry including a metal interconnection may be formed. A photodiode over a first substrate, the photodiode contacting the metal interconnection. The circuitry of the first substrate may include a first transistor and a second transistor over the first substrate, an electrical junction region between the first transistor and the second transistor, and a first conduction type region at one side of the second transistor, the first conduction type region being connected to the metal interconnection, wherein the first substrate has an upper portion doped with second conduction type impurities.

According to embodiments, a method for manufacturing an image sensor may include at least one of the following. Forming a circuitry including a metal interconnection over a first substrate. Forming a photodiode over the metal interconnection. Forming of the circuitry of the first substrate may include at least one of the following. Forming a first transistor and a second transistor over the first substrate. Forming an electrical junction region between the first transistor and the second transistor. Forming a first conduction type region at one side of the second transistor, the first conduction type region being connected to the metal interconnection.

DRAWINGS

Example FIGS. 1 through 7 illustrate an image sensor and a method for manufacturing an image sensor, according to embodiments.

DESCRIPTION

An image sensor and a method for manufacturing an image sensor in accordance with embodiments will be described in detail with reference to the accompanying drawings.

Example FIG. 1 is a sectional view of an image sensor, according to embodiments. Referring to example FIG. 1, according to embodiments, an image sensor may include first substrate 100. Metal interconnection 150 and circuitry 120 may be formed on and/or over first substrate 100. An image sensor may also include photodiode 210 contacting metal interconnection 150. Photodiode 210 may be formed on and/or or over first substrate 100. According to embodiments, circuitry 120 of first substrate 100 may include first transistor 121a and second transistor 121b formed on and/or over first substrate 100, electrical junction region 140 formed between first transistor 121a and second transistor 121b, and high concentration first conduction type region 131b connected to metal interconnection 150 at one side of second transistor 121b.

Figure 3:
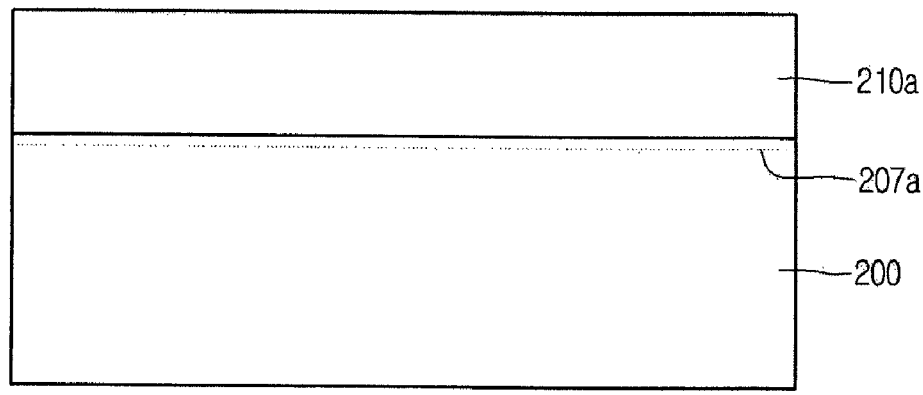

According to embodiments, photodiode 210 may be formed in crystalline semiconductor layer 210a (example FIG. 3). According to embodiments, since an image sensor may implement a vertical type photodiode where a photodiode may be positioned over a circuitry, and the photodiode may be formed in the crystalline semiconductor layer, generation of defects inside a photodiode may be prevented.

A method for manufacturing an image sensor in accordance with embodiments will be described with reference to example FIGS. 2 through 6. Referring to example FIG. 2, first substrate 100 may include metal interconnection 150 and readout circuitry 120 and may be prepared first. According to embodiments, first substrate 100 may be a second conduction type substrate. According to embodiments, first substrate 100 may be any conduction type substrate.

According to embodiments, device isolation layer 110 may be formed in second conduction type first substrate 100 and may thereby define an active region. Readout circuitry 120 may include at least one transistor and may be formed in an active region. According to embodiments, readout circuitry 120 may include transfer transistor (Tx) 121, reset transistor (Rx) 123, drive transistor (Dx) 125, and select transistor (Sx) 127. Ion implantation regions 130 may then be formed. According to embodiments, ion implantation regions 130 may include first floating diffusion region (FD) 131a and source/drain regions 133, 135, and 137.

A process of forming readout circuitry 120 on and/or over first substrate 100 will be described, according to embodiments. According to embodiments, first transistor 121a and second transistor 121b may be formed on and/or over first substrate 100. According to embodiments, first transistor 121a and second transistor 121b may be first transfer transistor 121a and second transfer transistor 121b, respectively. According to embodiments, first transistor 121a and second transistor 121b may be any type of transistor. First transistor 121a and second transistor 121b may be simultaneously or sequentially formed.

According to embodiments, electrical junction region 140 may be formed between first transistor 121a and second transistor 121b. According to embodiments, electrical junction region 140 may be PN junction 140. According to embodiments, electrical junction region 140 may be any type of junction.

According to embodiments, electrical junction region 140 may include first conduction type ion implantation layer 143 formed on and/or over either second conduction type well 141 or second conduction type epitaxial layer 141. Electrical junction region 140 may also include second conduction type ion implantation layer 145 formed on and/or over first conduction type ion implantation layer 143. According to embodiments, PN junction 140 may be a P0 (145)/N–(143)/P– (141) junction.

According to embodiments, high concentration first conduction type region 131b may be formed at one side of second transistor 121b, and may be connected to metal interconnection 150. According to embodiments, high concentration first conduction type region 131b, which may be a high concentration N+ ion implantation region (N+ junction), may serve as second floating diffusion region (FD2) 131b.

According to embodiments, readout circuitry 120 may allow electrons generated in photodiode 210 formed on and/or over a chip to move toward N+ junction 131b of a substrate (Si sub) with a circuit formed. According to embodiments, readout circuitry 120 may allow electrons in N+ junction 131B to move toward N– junction 143. This may make it possible to perform a 4Tr operation.

According to embodiments, P0/N–/P– junction 140 and N+ junction 131b may be separated from each other. According to embodiments, this may be because when forming an N+ doped region and a contact in a P/N/P junction of P0/N–/P–Epi 140, a dark current may be generated due to N+ junction 131b and etch damage caused by contact-etching. According to embodiments, to prevent a generation of dark current, a contact forming portion, i.e., N+ junction 131b may be separated from P/N/P junction 140.

That is, a process of doping N+ impurities onto a surface of P/N/P junction 140 and a contact-etching process may provide a leakage source. For this reason, a contact may be formed in N+/P–Epi junction 131b.

When a signal is read out, a gate of second transistor (Tx2) 121b may be turned on. According to embodiments, electrons generated by photodiode 210 formed on and/or over a chip may move to a node of first floating diffusion region (FD1) 131a via P0/N–/P–Epi junction 140. This may make it possible to perform correlated double sampling (CDS).

According to embodiments, interlayer dielectric 160 may be formed on and/or over first substrate 100, and metal interconnection 150 may then be formed. According to embodiments, metal interconnection 150 may include first metal contact 151a, first metal 151, second metal 152, third metal 153, and fourth metal contact 154a.

Referring to example FIG. 3, crystalline semiconductor layer 210a may be formed on and/or over second substrate 200. Since photodiode 210 may be formed in crystalline semiconductor layer 210a, a defect inside a photodiode may be prevented.

According to embodiments, crystalline semiconductor layer 210a may be formed on and/or over second substrate 200 through an epitaxial growth method. According to embodiments, hydrogen ions may be implanted into an interface between second substrate 200 and crystalline semiconductor layer 210a. This may form hydrogen ion implantation layer 207a. According to embodiments, implanting of hydrogen ions may be performed after implanting impurity ions for a formation of photodiode 210.

Figure 4:
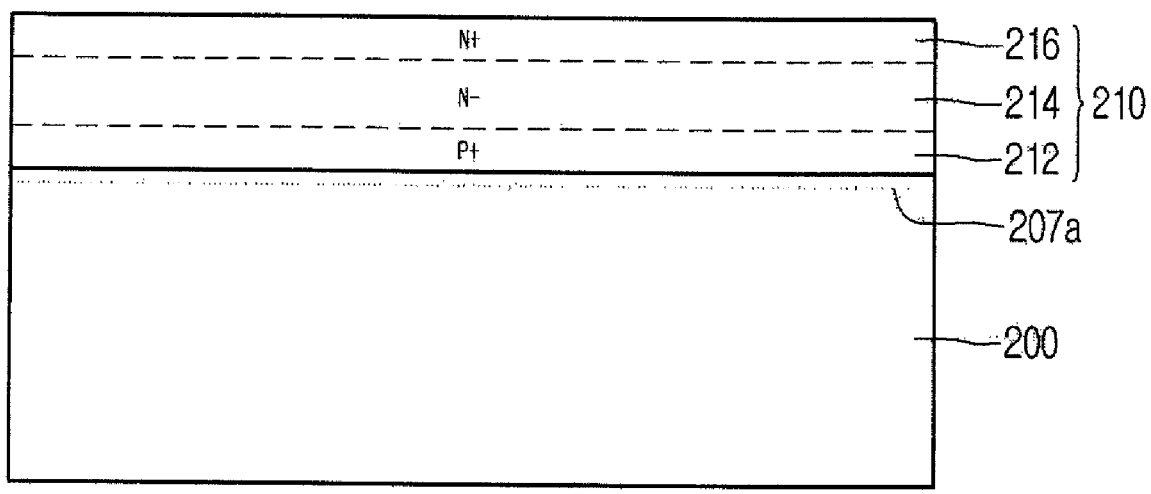

Referring to example FIG. 4, impurity ions may be implanted into crystalline semiconductor 210a and may form photodiode 210. According to embodiments, second conduction type conduction layer 216 may be formed at an upper portion of crystalline semiconductor layer 210a. Second conduction type conduction layer 216 may be a high concentration P-type conduction layer. According to embodiments, high concentration P-type conduction layer 216 may be formed on and/or over crystalline semiconductor layer 210a by performing a first blanket-ion implantation onto an entire surface of second substrate 200 without a mask. According to embodiments, second conduction type conduction layer 216 may be formed at a junction depth of less than approximately 0.5 μm.

According to embodiments, first conduction type conduction layer 214 may be formed under and/or below second conduction type conduction layer 216 by performing a second blanket-ion implantation onto an entire surface of second substrate 200 without a mask. First conduction type conduction layer 214 may be a low concentration N-type conduction layer. According to embodiments, low concentration first conduction type conduction layer 214 may be formed at a junction depth ranging from approximately 1.0 μm to approximately 2.0 μm.

According to embodiments, high concentration first conduction type conduction layer 212 may be formed under and/or below first conduction type conduction layer 214. According to embodiments, high concentration N+ conduction layer 212 may be formed under and/or below first conduction type conduction layer 214 by performing a third blanket-ion implantation onto an entire surface of second substrate 200 without a mask. According to embodiments, high concentration N+ conduction layer 212 may contribute to ohmic contact.

Figure 5:
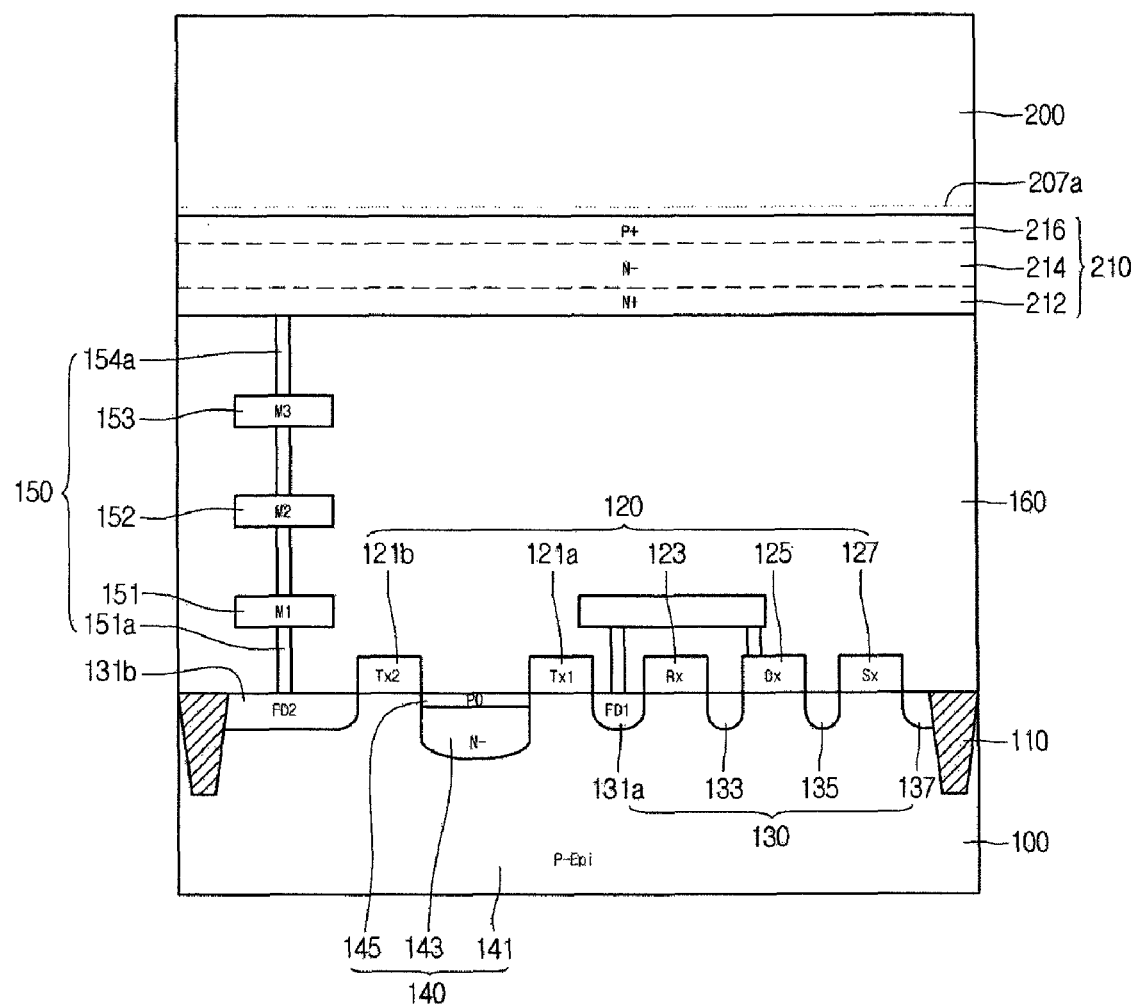

Referring to example FIG. 5, first substrate 100 and second substrate 200 may be bonded to each other. According to embodiments, photodiode 210 may contact metal interconnection 150. According to embodiments, the bonding may be performed by contacting first substrate 100 and second substrate 200 to each other and then performing activation by plasma, which may increase a surface energy in a bonding surface. According to embodiments, hydrogen ion implantation layer 207a may be changed into a hydrogen gas layer by performing heat treatment to second substrate 200.

Figure 6:
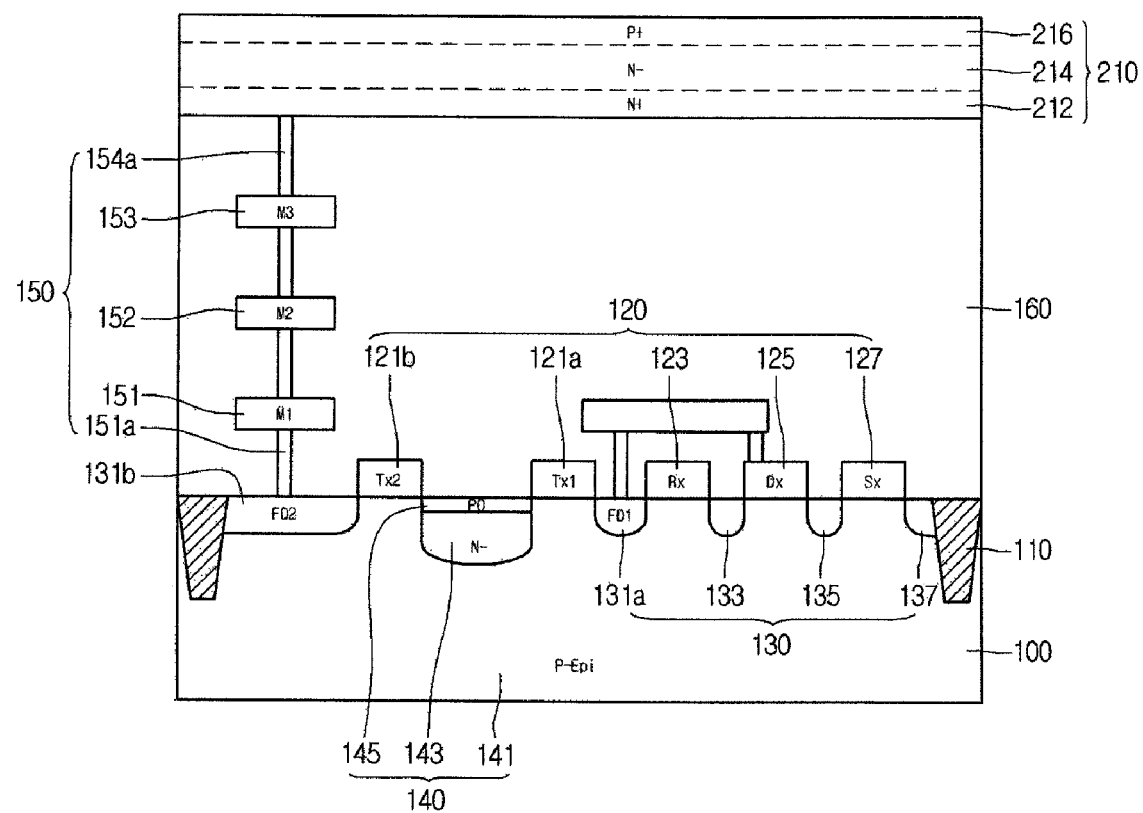

Referring to example FIG. 6, a portion of second substrate 200 may then be removed, and photodiode 210 may be left under the hydrogen gas layer. Photodiode 210 may thereby be exposed. According to embodiments, removal of second substrate 200 may be performed using a cutting apparatus, such as a blade.

According to embodiments, an etching process to separate photodiode 210 for each unit pixel may be performed. According to embodiments, an etched portion may then be filled with an interpixel dielectric. According to embodiments, an upper electrode and a color filter may be formed.

Figure 7:
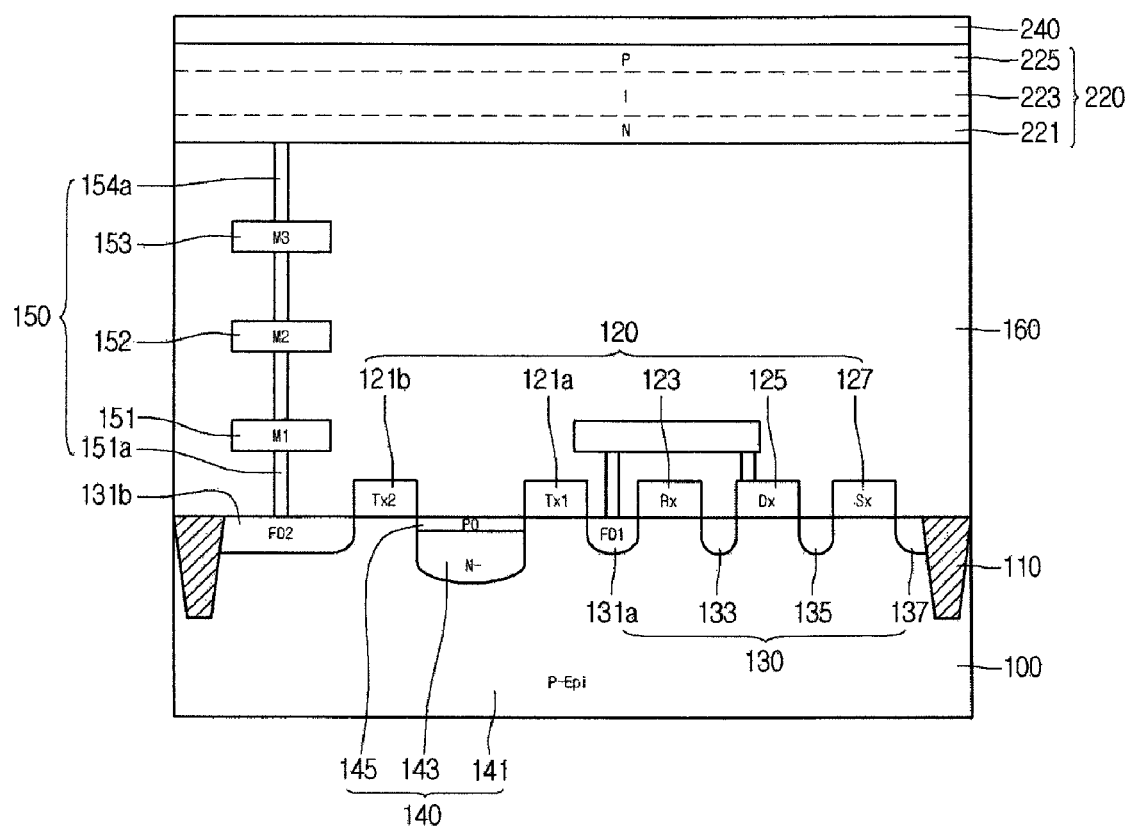

Example FIG. 7 is a sectional view of an image sensor, according to embodiments. According to embodiments, a device illustrated in example FIG. 7 may adopt various technical characteristics of embodiments illustrated in example FIGS. 1 through 6.

Unlike embodiments illustrated in example FIGS. 1 through 6, an image sensor according to embodiments illustrated in example FIG. 7 may include photodiode 220 that may be formed in an amorphous layer. According to embodiments, photodiode 220 may include intrinsic layer 223 electrically connected to metal interconnection 150 and second conduction type conduction layer 225 on and/or over intrinsic layer 223. According to embodiments, an image sensor may further include first conduction type conduction layer 221 between lower electrode 210 and intrinsic layer 223.

A process of forming photodiode 220 in accordance with embodiments will be described. Unlike in embodiments illustrated in example FIGS. 1 through 6, an image sensor according to embodiments illustrated in example FIG. 7 may include photodiode 220 that may be formed by performing a deposition process on and/or over first substrate 100 on and/or over which readout circuitry 120 including metal interconnection 150 may be formed. According to embodiments, the process may not include bonding.

According to embodiments, first conduction type conduction layer 221 may be formed on and/or over first substrate 100. According to embodiments, first conduction type conduction layer 221 may contact metal interconnection 150. According to embodiments, a subsequent process may be performed without forming first conduction type conduction layer 221. First conduction type conduction layer 221 may act as an N-layer of a PIN diode implemented in embodiments. According to embodiments, first conduction type conduction layer 221 may be an N-type conduction layer. According to embodiments, first conduction type conduction layer 221 may be any type conduction layer.

First conduction type conduction layer 221 may be formed of n-doped amorphous silicon. According to embodiments, a process may not be limited thereto. According to embodiments, first conduction type conduction layer 221 may be formed of at least one of a-Si:H, a-SiGe:H, a-SiC, a-SiN:H, and a-SiO:H, which may be formed by adding at least one of Ge, C, N, and O, to amorphous silicon. According to embodiments, first conduction type conduction layer 221 may be formed other similar compounds.

According to embodiments, first conduction type conduction layer 221 may be formed by a CVD. According to embodiments, first conduction type conduction layer 221 may be formed by a PECVD. According to embodiments, first conduction type conduction layer 141 may be formed of amorphous silicon by a PECVD in which PH3, P2H5, and/or other similar compounds may be mixed with silane (SiH4) gas.

According to embodiments, intrinsic layer 223 may be formed on and/or over first conduction type conduction layer 221. Intrinsic layer 223 may act as an I-layer of a PIN diode implemented in embodiments. According to embodiments, intrinsic layer 223 may be formed of amorphous silicon. According to embodiments, intrinsic layer 223 may be formed by a CVD. According to embodiments, intrinsic layer 223 may be formed by a PECVD. According to embodiments, intrinsic layer 223 may be formed by a PECVD using silane (SiH4) gas.

According to embodiments, second conduction type conduction layer 225 may be formed on and/or over intrinsic layer 223. Second conduction type conduction layer 225 and intrinsic layer 223 may be formed in-situ. Second conduction type conduction layer 225 may act as a P-layer of a PIN diode employed in embodiments. According to embodiments, second conduction type conduction layer 225 may be a P-type conduction layer. According to embodiments, second conduction type conduction layer 225 may be any type conduction layer.

According to embodiments, second conduction type conduction layer 225 may be formed of Phosphorous (P)-doped amorphous silicon. According to embodiments, other processes may be used. Second conduction type conduction layer 225 may be formed by a CVD. According to embodiments, second conduction type conduction layer 225 may be formed by a PECVD. According to embodiments, second conduction type conduction layer 225 may be formed of amorphous silicon by a PECVD in which Boron (B) or another similar element may be mixed with silane (SiH4) gas.

According to embodiments, upper electrode 240 may be formed on and/or over second conduction type conduction layer 225. Upper electrode 240 may be formed of a transparent electrode material, which may have a high light transmission and a high conductivity. According to embodiments, upper electrode 240 may be formed of indium tin oxide (ITO), cadmium tin oxide (CTO), and/or other similar compound.

According to embodiments, an image sensor and manufacturing method thereof may provide a vertical integration of circuitry and a photodiode.

According to embodiments, a method of manufacturing a 3-dimensional (3D) image sensor having a vertical configuration may provide correlated double sampling (CDS) substantially similar to 4-Tr pixel operation, while minimizing a dark current that may be generated during a contact-etching process of connecting a photodiode formed on and/or over a chip to a substrate (Si-sub) having circuitry formed thereon, and a high concentration N+doping process. Consequently, it may be possible to minimize noise as well as dark current.

According to embodiments, a vertical integration of a circuitry and a photodiode may achieve a fill factor close to 100%. According to embodiments, a vertical integration of circuitry and a photodiode may provide a sensitivity higher than that in the related art with an equal pixel size.

Although embodiments may be described with respect to a complementary metal oxide semiconductor (CMOS) image sensor, embodiments may not be limited to a CIS. According to embodiments, any image sensor requiring a photodiode may be used.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A device, comprising:
a first substrate;
a circuitry including a metal interconnection formed over the first substrate; and
a photodiode over the first substrate, the photodiode contacting the metal interconnection, wherein the circuitry of the first substrate comprises:
a first transistor and a second transistor over the first substrate;
an electrical junction region between the first transistor and the second transistor;
a first conduction type region at one side of the second transistor, the first conduction type region being connected to the metal interconnection; and
first and second floating diffusion regions formed in the first substrate,
wherein the second floating diffusion region is connected to the metal interconnection.

2. The device of claim 1, wherein the electrical junction region comprises:
a first conduction type ion implantation region over the first substrate; and
a second conduction type ion implantation region over the first conduction type ion implantation region.

3. The device of claim 2, wherein the electrical junction region comprises a PN junction.

4. The device of claim 3, wherein the PN junction comprises a P0/N−/P− junction.

5. The device of claim 1, wherein the first conduction type region comprises an N+ region.

6. The device of claim 1, wherein the photodiode is formed in a crystalline semiconductor layer and is electrically connected to the metal interconnection.

7. The device of claim 6, wherein the crystalline semiconductor layer is formed over a second substrate, and wherein the second substrate is bonded to the first substrate.

8. A device, comprising:
a semiconductor substrate;
readout circuitry including a metal interconnection formed over the semiconductor substrate; and
a photodiode over the semiconductor substrate, wherein the photodiode contacts the metal interconnection, and wherein the circuitry of the semiconductor substrate comprises:
a first transistor and a second transistor over the semiconductor substrate;
an electrical junction region between the first transistor and the second transistor; and
a first conduction type region at one side of the second transistor, the first conduction type region being connected to the metal interconnection; and
first and second floating diffusion regions formed in the first substrate,
wherein the second floating diffusion region is connected to the metal interconnection, and
wherein the semiconductor substrate has an upper portion doped with second conduction type impurities.

9. The device of claim 8, wherein the electrical junction region comprises:
a first conduction type ion implantation region over the second conduction type region of the semiconductor substrate; and
a second conduction type ion implantation region over the first conduction type ion implantation region.

10. The device of claim 8, wherein the semiconductor substrate has an upper portion doped with P-type impurities, and the electrical junction region comprises a PN junction.

11. The device of claim 8, wherein the first and second transistors comprise transfer transistors.

* * * * *